US009917662B2

United States Patent
Jurisch

(10) Patent No.: US 9,917,662 B2
(45) Date of Patent: Mar. 13, 2018

(54) DIGITAL MEASUREMENT INPUT FOR AN ELECTRIC AUTOMATION DEVICE, ELECTRIC AUTOMATION DEVICE COMPRISING A DIGITAL MEASUREMENT INPUT, AND METHOD FOR PROCESSING DIGITAL INPUT MEASUREMENT VALUES

(71) Applicant: SIEMENS AKTIENGESELLSCHAFT, Munich (DE)

(72) Inventor: Andreas Jurisch, Schwante (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 15/109,874

(22) PCT Filed: Jan. 22, 2014

(86) PCT No.: PCT/EP2014/051196
§ 371 (c)(1),
(2) Date: Jul. 6, 2016

(87) PCT Pub. No.: WO2015/110150
PCT Pub. Date: Jul. 30, 2015

(65) Prior Publication Data
US 2016/0329975 A1    Nov. 10, 2016

(51) Int. Cl.
*H04B 17/20* (2015.01)
*G05B 19/042* (2006.01)
(Continued)

(52) U.S. Cl.
CPC .............. *H04B 17/20* (2015.01); *G05B 11/32* (2013.01); *G05B 19/0423* (2013.01);
(Continued)

(58) Field of Classification Search
CPC .......... H04L 25/0234; H04L 25/03834; H04B 1/0042
(Continued)

(56) References Cited

U.S. PATENT DOCUMENTS 4,870,661 A * 9/1989 Yamada ............. H03H 17/0628
341/61
5,253,056 A * 10/1993 Puri ....................... G06T 3/4084
375/240.01
(Continued)

FOREIGN PATENT DOCUMENTS

DE          19860720 A1    6/2000
EP           2503668 A1    9/2012

*Primary Examiner* — Emmanuel Bayard
(74) *Attorney, Agent, or Firm* — Laurence Greenberg; Werner Stemer; Ralph Locher

(57) ABSTRACT

A digital measurement input for an electric automation device has a receiving device configured to receive digital input measurement values generated by sampling an analog measurement signal at a first sampling rate, and a signal converting device configured to generate digital output measurement values from the digital input measurement values and to provide digital output measurement values. The sampling rate and sampling times of each digital output measurement value is adapted to a specified sampling rate and/or specified sampling time. The signal converting device has a digital encoder filter on the input side and a digital decoder filter on the output side, between which an interpolator is provided. The encoder filter, the interpolator, and the decoder filter are matched to one another so as to adapt the sampling rate and/or sampling time of the digital input measurement values.

16 Claims, 5 Drawing Sheets

(51) Int. Cl.
  *G05B 11/32* (2006.01)
  *H04B 1/00* (2006.01)
  *H04B 1/16* (2006.01)
  *H04L 25/03* (2006.01)
  *G01R 19/25* (2006.01)

(52) U.S. Cl.
  CPC ............ *H04B 1/0042* (2013.01); *H04B 1/16* (2013.01); *H04L 25/03834* (2013.01); *G01R 19/2509* (2013.01); *G05B 2219/21126* (2013.01); *G05B 2219/21137* (2013.01); *G05B 2219/37533* (2013.01)

(58) Field of Classification Search
  USPC ................................. 375/224, 346, 350, 343
  See application file for complete search history.

(56) References Cited

U.S. PATENT DOCUMENTS

| | | | | |
|---|---|---|---|---|
| 5,265,219 | A * | 11/1993 | Gerson | G10L 19/02 704/219 |
| 6,137,349 | A | 10/2000 | Menkhoff et al. | |
| 6,201,499 | B1 * | 3/2001 | Hawkes | G01S 1/045 342/387 |
| 6,208,671 | B1 * | 3/2001 | Paulos | H03H 17/0628 341/61 |
| 6,226,758 | B1 * | 5/2001 | Gaalaas | G11B 20/10527 713/600 |
| 6,650,258 | B1 * | 11/2003 | Kelly | H03H 17/0671 341/61 |
| 6,785,267 | B1 * | 8/2004 | Knappe | H04L 12/6418 370/353 |
| 6,947,096 | B2 * | 9/2005 | Kumazawa | H04N 9/641 348/488 |
| 6,950,799 | B2 * | 9/2005 | Bi | G10L 21/00 704/261 |
| 7,327,815 | B1 | 2/2008 | Jurisch | |
| 7,647,069 | B2 * | 1/2010 | Zhang | H04B 1/406 375/219 |
| 7,738,615 | B2 * | 6/2010 | Mizutani | H03H 17/0621 341/61 |
| 9,363,421 | B1 * | 6/2016 | Russell | H04N 1/64 |
| 2004/0102966 | A1 * | 5/2004 | Sung | G10L 19/12 704/219 |
| 2006/0015795 | A1 * | 1/2006 | Miura | G11B 20/10527 714/776 |
| 2006/0095269 | A1 * | 5/2006 | Smith | H04S 3/02 704/500 |
| 2006/0106600 | A1 * | 5/2006 | Bessette | G10L 19/12 704/223 |
| 2006/0136229 | A1 * | 6/2006 | Kjoerling | G10L 19/008 704/501 |
| 2006/0235685 | A1 * | 10/2006 | Nurminen | G10L 13/033 704/235 |
| 2007/0046517 | A1 * | 3/2007 | Behboodian | H03M 7/3008 341/143 |
| 2013/0039430 | A1 * | 2/2013 | Su | H04N 19/46 375/240.25 |
| 2013/0301702 | A1 * | 11/2013 | Minoo | H04N 19/119 375/240.02 |
| 2014/0074415 | A1 | 3/2014 | Rudolph | |
| 2014/0078394 | A1 * | 3/2014 | Lou | H04N 11/20 348/453 |
| 2014/0146969 | A1 * | 5/2014 | Sadot | H04K 1/04 380/256 |
| 2014/0235192 | A1 * | 8/2014 | Purnhagen | G10L 19/008 455/296 |
| 2014/0236588 | A1 * | 8/2014 | Subasingha | G10L 19/07 704/219 |
| 2014/0365231 | A1 * | 12/2014 | Hoerich | G10L 19/24 704/500 |

* cited by examiner

DIGITAL MEASUREMENT INPUT FOR AN ELECTRIC AUTOMATION DEVICE, ELECTRIC AUTOMATION DEVICE COMPRISING A DIGITAL MEASUREMENT INPUT, AND METHOD FOR PROCESSING DIGITAL INPUT MEASUREMENT VALUES

BACKGROUND OF THE INVENTION

Field of the Invention

The invention relates to a digital measurement input for an electric automation device, comprising a receiving device which is configured to receive digital input measurement values which have been generated by sampling an analog measurement signal at a first sampling rate, and a signal conversion device which is designed to form and provide digital output measurement values from the digital input measurement values, wherein the sampling rate and/or the respective sampling time of the digital output measurement values is/are adapted to a specified sampling rate and/or specified sampling times. The invention furthermore relates to an automation device comprising a digital measurement input of this type, and a method for processing digital input measurement values.

Electric automation devices are used, for example, to control, monitor and protect power grids. To do this, the automation devices are conventionally disposed as close as possible to a measurement point and capture analog measurement signals by means of sensors, e.g. current and/or voltage transformers, disposed at the measurement point, said measurement signals subsequently being further processed in the automation device. An essential step in the further processing is the conversion of the analog measurement signal into digital sampling values which describe the sequence of the analog signal. Control, monitoring and protection functions can then be performed in the automation device using these digital sampling values. If the automation device cannot be disposed close to all sensors, the analog measurement signals are fed to the automation device via corresponding measurement lines.

More recently, attempts have been made to convert the analog measurement signals close to the sensor into digital measurement signals with so-called "merging units". The reason for this is, inter alia, the emergence of new sensor and transformer types (e.g. Rogowski transformers, optical transformers), the signals of which can no longer be distributed in an analog manner over the hitherto usual distances. Here, a merging unit of this type has one or more analog measurement inputs, the analog input signals of which are then sampled with an analog-to-digital converter of the merging unit and are thus converted into digital measurement values. The digital measurement values are output at an output of the merging unit, normally in the form of data messages, and are transmitted via a communication network or a communication bus to one or more higher-order automation devices. One example of a merging unit of this type can be found e.g. in European patent application EP 2503668 A1.

However, new types of problems arise with the use of digital measurement values generated via merging units, essentially relating to the sampling rate and/or sampling times of the respective digital measurement values that are used to form the digital measurement values in the merging unit. It may thus occur, for example, that the automation device requires digital measurement values internally at a sampling rate which differs from the sampling rate used in the merging unit. In addition, if a plurality of different measurement signals are used, the requirement exists that said measurement signals must be comparable in terms of their sampling rate and their sampling times. This occurs for example in the case of automation devices which have a plurality of digital signal inputs which receive digital measurement values from different merging units. Some merging units are normally time-synchronized with one another via an external time synchronization signal (e.g. 1PPS time pulses of the GPS signal) and as a result have the facility to match their sampling rates and sampling times with one another. However, this synchronization is highly complex and can only be maintained conditionally if the external time synchronization signal fails.

In addition, the measurement transformers themselves can already output digital measurement values at their outputs, but the problems arising here are not the same as with digital measurement values generated via merging units.

A digital measurement input of the aforementioned type and a method for synchronizing a plurality of digital input signals in an automation device are known, for example, from the German unexamined patent application (Offenlegungsschrift) DE 198 60 720 A1. According to the method known herefrom, the digital sampling values of a plurality of measurement signals are encoded by the merging unit with a first filter and are then transmitted to the automation device. Following the reception of the encoded digital measurement values, said automation device initially performs a resampling at a sampling rate which is at least twice as fast as the fastest sampling rate of the measurement signals.

Values not present in the sequence of the encoded digital measurement values are filled with zero values. The encoded digital measurement values resampled in this way are fed to an interpolation filter which has a filter characteristic which is the inverse of the encoder filter. As a result, it can be achieved that all digital input signals have a common sampling rate and common sampling times following the processing.

However, the implementation of this known method imposes comparatively stringent requirements on the processing capacity of the automation device; for example mirrored frequency components of the digital measurement signals, which must first be removed once more by means of complex filtering, arise due to the resampling at a relatively high sampling rate and the filling with zero values at half the frequency of the sampling rate used. Furthermore, current standards, e.g. the IEC 61850-9-2 standard, provide no signal encoding by a merging unit, so that the generated digital measurement signals cannot readily be processed with automation devices from different manufacturers.

BRIEF SUMMARY OF THE INVENTION

On the basis of a digital measurement input of the aforementioned type, the object of the invention is thus to indicate a digital measurement input with which interoperably usable digital input measurement values can be processed with efficient utilization of processing capacities of an automation device. The object of the invention is moreover to indicate a corresponding automation device comprising a digital measurement input, and a method for processing digital input measurement values.

In respect of the digital measurement input, in order to achieve this object, it is proposed according to the invention to develop a measurement input of the aforementioned type in such a way that the signal conversion device has a digital encoder filter on the input side and a digital decoder filter on the output side, between which an interpolator is provided, wherein the encoder filter, the interpolator and the decoder filter are matched with one another so that the sampling rate and/or sampling times of the digital input measurement values is/are adapted.

Due to the design of the signal conversion device of the digital measurement input, it is possible to perform an adaptation of the sampling rate and/or sampling times of the digital input measurement values without a signal encoding in the merging unit, as a result of which the interoperable usability of the digital input measurement values for devices from different manufacturers is guaranteed. Moreover, since no complex resampling with insertions of zero values is performed in the signal conversion device, the processing power required for the adaptation and the associated processing time are minimized. The two filters and the interpolator of the signal conversion device interact here in such a way that a required change of the sampling rate and/or shift of the sampling times of the digital output measurement values provided on the output side is achieved. For example, the sampling rate can be changed from 4 kHz to 16 kHz with the digital measurement input according to the invention by determining through interpolation the required additional sampling values for the digital output measurement values from the sequence of the digital input measurement values present on the input side. The interpolator can also estimate the sequence of digital output measurement values with sufficient accuracy on the basis of the known digital input measurement values for a defined future period, so that it is used, in a manner of speaking, as an extrapolator and estimates future digital output measurement values on the basis of a past sequence of digital input measurement values.

According to one advantageous embodiment of the digital measurement input according to the invention, it is provided that the interpolator is configured to generate interpolated digital auxiliary measurement values using a signal model.

The most accurate possible estimation of the auxiliary measurement values to be determined through interpolation and therefore the digital output measurement values can thereby be performed. In the simplest case, a linear interpolation on the basis of two known digital input measurement values can be used for the interpolation.

However, it is regarded as particularly advantageous if the signal model describes a quadratic function.

If a quadratic signal model having the following form is used:

$$y = a \cdot x^2 + b \cdot x + c,$$

the interpolated auxiliary measurement values and therefore the digital output measurement values y, on the one hand, can be determined with relatively high accuracy and, on the other hand, with an acceptable processing effort, since only the last three digital input measurement values are required in order to define the coefficients a, b and c of the interpolator.

A further advantageous embodiment of the digital measurement input according to the invention provides that the encoder filter and the decoder filter have individual transmission functions which can be matched with one another in such a way that their common transmission function effects an adjustable shift in the phase response of the sequence of digital input measurement values in order to generate a required temporal shift of the digital output measurement values compared with the digital input measurement values.

In this embodiment, a required temporal shift of the sequence of the digital output measurement values in relation to the sequence of the digital input measurement values can be achieved by the mere selection of the transmission functions of the two filters of the signal conversion device. This is achieved by influencing the phase response of the digital input measurement values. With corresponding matching of the transmission functions of the individual filters, a summation transmission function can be achieved which produces the required temporal shift effect. As a result, a temporal shift of the sequence of the digital output measurement values can be achieved in a comparatively simple manner, i.e. already by the definition of the respective filter coefficients, for example in order to undertake adaptations of a plurality of temporally shifted incoming digital measured value sequences.

Specifically, with regard to the two filters, it can be provided that the encoder filter has a PD (proportional-derivative) characteristic and the decoder filter has a low-pass characteristic.

Particularly due to the design of the decoder filter with a low-pass characteristic, it can be achieved that unwanted high-frequency components, already contained in the digital input measurement values or arising due to the interpolation, are sufficiently suppressed in the sequence of digital output measurement values so that they exert no interfering influences on a subsequent further processing of the digital output measurement values for control, monitoring and/or protection purposes.

According to a further advantageous embodiment of the digital measurement input according to the invention, it is provided that the digital measurement input is designed in the form of a processing module with hardware-defined programming, in particular an ASIC or an FPGA.

In comparison with a module running device software, the design of the digital measurement input in the form of a processing module with hardware-defined programming offers the advantage of higher processing speed, since any delays arising due to the processor-supported running of the device software can be excluded. The processing module can thus be designed in a highly specialized manner for the required processing task.

In this connection, it is furthermore regarded as advantageous if the processing module has a memory register in which filter coefficients of the encoder filter and/or the decoder filter are stored in modifiable form.

It can be achieved as a result that the transmission functions of the two filters can also be adapted subsequently according to a required signal response, in particular a required phase response of a common summation transmission function.

According to a further advantageous embodiment of the digital measurement input according to the invention, it is furthermore provided that the receiving device is designed to receive the digital input measurement values in the form of data messages.

The digital input measurement values can be transmitted from the merging unit to the automation device, for example as Sampled Measured Values (SMV) according to the IEC 61850 standard, specifically the IEC 61850-9-2 standard part, which is now commonly used for communication in energy automation plants. Interoperability is again increased through the use of an internationally recognized standard for the transmission of digital input measurement values.

In this connection, it is furthermore regarded as advantageous if the receiving device is configured to extract information relating to the first sampling rate from the data messages containing the digital input measurement values and to forward said information to the signal conversion device.

The information relating to the sampling rate at which the digital input measurement values are generated from the analog measurement signal is required by the interpolator in order to be able to arrange the received digital input measurement values in a temporally correct order. The information in question may either be contained directly in the data messages (for example the information can be transmitted once only or sporadically or continuously) or may be extracted indirectly from the digital input measurement values themselves. Timestamps, for example, which indicate the sampling time in the merging unit and from which the sampling rate can be calculated can be allocated by the merging unit to the digital input measurement values. Alternatively, the digital input measurement values may also comprise counter values which indicate their temporal sequence following a time synchronization pulse (e.g. a 1PPS signal). The sampling rate can similarly be inferred from the highest value of a counter value of this type (e.g. a highest value of 3999 means a sampling rate of 4 kHz, since the first value is normally given the counter value 0).

The aforementioned object in relation to the automation device is furthermore achieved by an automation device comprising a digital measurement input as claimed in one of the claims.

All statements made with regard to the digital measurement input according to the invention apply in relation to the automation device according to the invention and, in particular, the automation device according to the invention may comprise a digital measurement input according to any of the embodiments described above in relation thereto. In respect of the advantages of the automation device according to the invention, reference is also made to the advantages of the digital measurement input according to the invention.

Along with the digital measurement input, the automation device may also have its own local analog measurement inputs. In this case, it is regarded as an advantageous design of the electric automation device according to the invention if the electric automation device has at least one analog signal input which is configured to capture a local analog measurement signal and to form local digital measurement values, and if the signal conversion device of the digital measurement input is designed in such a way that it uses the sampling rate and/or the sampling times of the local digital measurement values as the specified sampling rate and/or specified sampling times in order to adapt the sampling rate and/or sampling times of the digital input measurement values.

In this embodiment, along with a digital measurement input, the automation device also has at least one analog measurement input, captures an analog measurement signal via the latter and samples it with its own analog-to-digital converter with formation of local digital measurement values. On the one hand, differences may exist here between the locally used sampling rate and the sampling rate of an upstream merging unit. On the other hand, the time delay arising due to the local sampling of the analog measurement signal will normally also differ from the time delay which arises in the sampling in the merging unit and the subsequent transmission of the digital input measurement values formed there to the automation device. The local processing in the automation device will normally produce a shorter time delay. Thus, in an automation device of this type with a mixed analog and digital measurement value acquisition, the sequence of the digital input measurement values must be adapted according to the sequence of the local digital measurement values in order to achieve the shortest possible time delay. This can be enabled, for example through corresponding design of the transmission functions of the two filters which influence the phase response of the incoming digital input measurement values, in such a way that, in a manner of speaking, time is turned back and the additional delay occurring in comparison with the local digital measurement values is eliminated. Furthermore, a temporal advance calculation of the digital output measurement values corresponding to this time delay can also be performed by the interpolator.

A further advantageous embodiment of the automation device according to the invention furthermore provides that the automation device has at least one further digital measurement input which is designed according to the digital measurement input.

Due to this embodiment, a plurality of digital measurement inputs can also be matched with one another or with any local analog measurement input so that the sampling rate and/or the sampling times of the respective digital output measurement values that are output on the output side are matched with one another, i.e. each measurement channel has its own temporal transmission characteristic which is designed to even out existing differences between the individual measurement channels.

Alternatively, it can also be provided that the first digital measurement input is designed to receive and process a plurality of sequences of digital input measurement values.

In this alternative, the different sequences of digital input measurement values are fed via a multiplexer to the signal adaptation device which, along the lines described above for the digital measurement input, performs an adaptation in respect of the sampling rate and/or sampling times for each signal individually.

The above-mentioned object is achieved in respect of the method by a method for processing digital input measurement values which have been generated by sampling an analog measurement signal at a first sampling rate, wherein the digital input measurement values are received in the method with a receiving device of a digital measurement input of an automation device, and digital output measurement values are formed and provided from the digital input measurement values with a signal conversion device of the digital measurement input, wherein the sampling rate and/or the respective sampling time of the digital output measurement values is/are adapted to a specified sampling rate and/or specified sampling times.

It is provided according to the invention that the digital input measurement values are filtered with a digital encoder filter of the signal conversion device with formation of encoded digital input measurement values, the encoded digital input measurement values are interpolated with an interpolator of the signal conversion device with formation of digital auxiliary measurement values, and the digital auxiliary measurement values are filtered with a digital decoder filter of the signal conversion device with formation of the digital output measurement values, wherein the encoder filter, the interpolator and the decoder filter are matched with one another in such a way that they effect the adaptation of the sampling rate and/or sampling times of the digital input measurement values.

In respect of the method according to the invention, all statements already made in respect of the digital measurement input according to the invention and the automation device according to the invention additionally apply, so that the method according to the invention is also suitable for processing the digital input measurement values according to any of the embodiments of the digital measurement input according to the invention and of the automation device according to the invention described above. Also in respect of the advantages of the method according to the invention, reference is made to the advantages of the digital measurement input according to the invention and the automation device according to the invention.

One advantageous embodiment of the method according to the invention furthermore provides that a common transmission function resulting from a linking of the individual transmission functions of the encoder filter and the decoder filter effects an adjustable shift of the phase response of the sequence of digital input measurement values in order to generate a required temporal shift of the digital output measurement values compared with the digital input measurement values.

In this embodiment, a required temporal shift of the sequence of the digital output measurement values in relation to the sequence of the digital input measurement values can be achieved through the mere selection of the transmission functions of the two filters of the signal conversion device.

The invention is explained below with reference to an example embodiment. The specific design of the example embodiment is in no way limiting for the general design of the digital measurement input according to the invention, the automation device according to the invention and the method according to the invention; instead, individual design features of the example embodiment can be freely combined in any given manner with one another and with the features described above.

DESCRIPTION OF THE INVENTION

Figure 1:
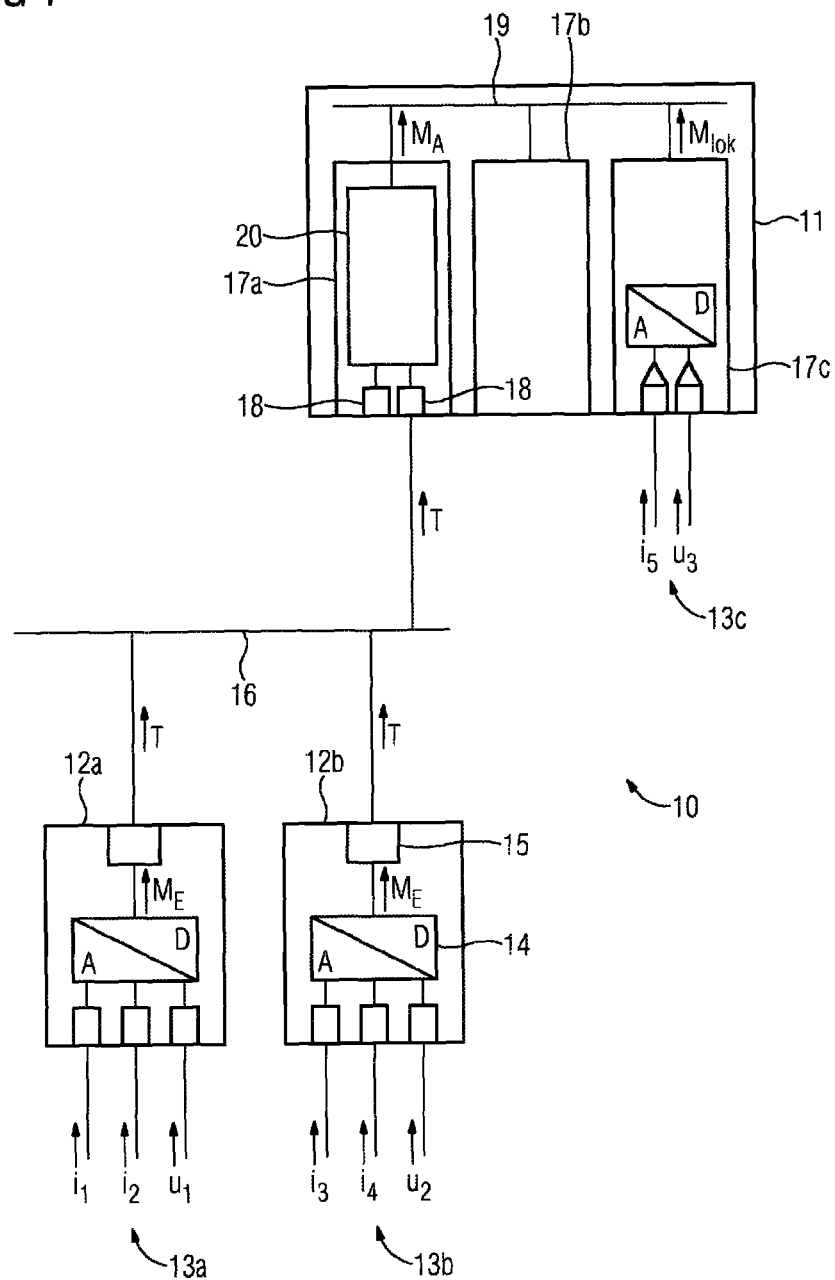
FIG. 1 shows a schematic representation of an energy automation plant with merging units connected to an electric automation device.

FIG. 1 shows a highly schematic representation of an energy automation system 10 with an automation device 11 and two merging units 12a-b. The automation device 11 may, for example, be an energy automation system which serves to control, monitor and/or protect a power grid not shown in FIG. 1. However, the automation device 11 described below does not necessarily have to be used in an energy automation system, but can be used for the automation of plants and processes wherever externally formed digital measurement values need to be processed.

Analog measurement signals indicating, for example, currents and/or voltages prevailing at measurement points 13a-b are captured by means of suitable transformers at measurement points 13a-b of the power grid. Specifically, for example, analog current signals $i_1$, $i_2$, $i_3$ and $i_4$ and analog voltage signals $u_1$ and $u_2$ are captured at the measurement points 13a and 13b and are forwarded to the merging units 12a-b. The signal processing is described below by way of example with reference to the merging unit 12b, wherein the description is applicable accordingly to the merging unit 12a also. The merging unit 12b converts the received analog measurement signals, here specifically the signals $i_3$, $i_4$, $u_2$, into digital input measurement values $M_E$ by sampling with an analog-to-digital converter 14. The analog-to-digital converter 14 can use a sampling rate of 4 kHz, for example, for the sampling. The sampling rate can be synchronized by an external time synchronization signal, e.g. a 1PPS (1PPS=1 Pulse per Second) pulse, or may be free-running. The merging unit 12b forms data messages T with the digital input measurement values $M_E$ and forwards them on the output side via a data interface 15 to a data communication bus 16, also referred to as a process bus, for the transmission of process-related measurement values, event data and commands. The data messages T containing the digital input measurement values $M_E$ may, for example, be designed as "Sampled Measured Values" (SMV) according to the IEC 61850-9-2 standard and can be transmitted via an Ethernet-based data communication bus 16.

The data messages T are fed to the automation device 11. The latter has a process bus module 17a with which the messages T are received and the digital input measurement values $M_E$ are extracted therefrom. The process bus module 17a has at least one physical process bus interface, e.g. an Ethernet interface 18, for receiving the data messages T. In the example embodiment according to FIG. 1, the process bus module 17a has only two process bus interfaces 18 by way of example, wherein the specific number of process bus interfaces is optional. The sampling rate and/or sampling times of the digital input measurement values is/are adapted in the process bus module 17a in a manner described in detail below to a specified sampling rate and/or specified sampling times with formation of digital output measurement values $M_A$ and is/are made available on the output side for further processing.

Along with the process bus module 17a, the automation device 11 also has a processor module 17b and an analog input module 17c. The individual modules 17a-17c are interconnected via an internal communication bus 19 via which internal data are exchanged, and a time synchronization of the individual modules 17a-17c is also carried out so that all modules 17a-17c of the automation device 11 use the same system time.

The analog input module 17c is connected directly to measurement transformers disposed at a further measurement point 13c of the power grid and, from said transformers, captures, for example, an analog current signal $i_5$ and an analog voltage signal $u_3$. These locally captured analog measurement signals are fed to an analog-to-digital converter of the analog input module 17c and are converted into local digital measurement values $M_{lok}$. A sampling rate of 16 kHz, for example, which is controlled via the system time and can be precisely compared with other signals by means of an external time synchronization signal (e.g. a 1PPS pulse) is used for this purpose.

The local digital measurement values $M_{lok}$ are used by the processor module 17b in the same way as the digital output measurement values $M_A$ provided via the process bus module 17*a* to perform control, monitoring and/or protection functions for the power grid. If the automation device 11 is, for example, an electric protection device, protection algorithms, such as e.g. a distance protection algorithm or a differential protection algorithm, inter alia, are executed by the processor module 17*b* in order to be able to detect faults in and shut down the power grid.

To perform the functions, the processor module 17*b* requires measurement values that are comparable with one another, i.e. the sampling rate and/or sampling time of the digital input measurement values $M_E$ received from the process bus module 17*a* must be adapted to the local digital measurement values $M_{lok}$ formed from the locally captured analog signals. In the present case, both the sampling rate and the sampling times of the digital input measurement values $M_E$ and the local digital measurement values $M_{lok}$ should differ from one another since, on the one hand, a sampling rate differing from that used in the automation device 11 is used in the merging units 12*a-b* (e.g. 4 kHz instead of 16 kHz), and, on the other hand, the sampling times of the individual measurement value sequences are not synchronized with one another. The sampling rate and sampling times of the digital input measurement values $M_E$ received via the process bus module 17*a* must therefore be adapted to the local digital measurement values $M_{lok}$ by means of a digital measurement input 20 with formation of the digital output measurement values $M_A$ before being forwarded to the processor module 17*b*.

FIG. 1 shows the automation device 11 merely by way of example as a device having a modular structure; this structure is, however, irrelevant to the invention, so that non-modular automation devices or devices with a different module division can also be used. Furthermore, an analog measurement input does not necessarily have to be present, since it is more or less sufficient if only the digital measurement output 20 is present. In addition, a plurality of digital measurement inputs which are structured according to the digital measurement input 20 described below may also be present. Moreover, it is possible to capture data messages from a plurality of measurement channels with the same digital measurement input and distribute them internally, e.g. through suitable multiplexing, among the individual measurement channels. If a plurality of digital measurement inputs are present, the digital input measurement values captured via them may have different sampling times and/or different sampling frequencies.

Figure 2:
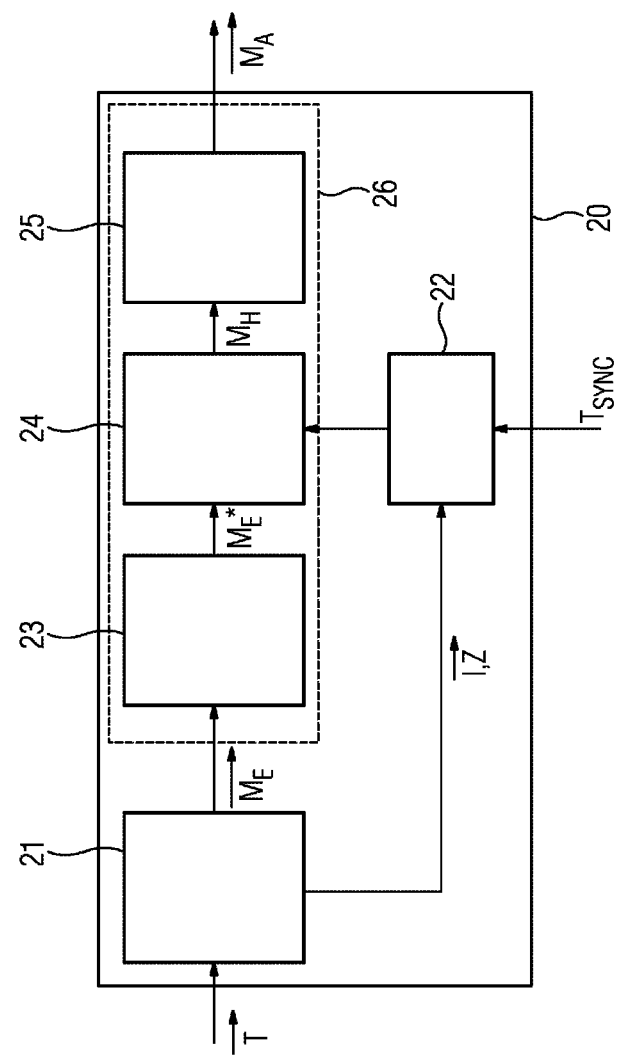
FIG. 2 shows a schematic representation of an example embodiment of a digital measurement input with a signal conversion device.

The mode of operation of the digital measurement input 20 is explained in detail below with reference to FIG. 2. FIG. 2 shows individual components of the digital measurement input 20 in a separate representation. These components may be designed as individual or combined hardware or software modules or a combination thereof.

FIG. 2 shows the digital measurement input 20 which may, for example, form part of the process bus module 17*a* (cf. FIG. 1). The digital measurement input 20 has, inter alia, a receiving device 21 to receive the data messages T containing the digital input measurement values $M_E$ and a signal conversion device 26 to process the received digital input measurement values $M_E$. The receiving device 21 extracts the digital input measurement values $M_E$ from the data messages T and allocates them to the individual analog measurement signals of the merging units 12*a-b*. Individual sequences of digital input measurement values $M_E$ are produced for each analog measurement signal. These can be fed for further processing, for example by means of a suitable multiplexing. In the interests of simplicity, the method described below for processing the digital input measurement values $M_E$ is explained by way of example only for the digital input measurement values $M_E$ of a single analog measurement signal.

Along with the digital input measurement values $M_E$ themselves, the receiving device 21 also extracts information I relating to the sampling rate at which the digital input measurement values $M_E$ are generated in the merging unit 12*a-b* and relating to the sampling time Z of the respective digital input measurement value $M_E$ from the data messages T. For example, the information I relating to the sampling rate used may be contained directly in one, some, or all of the data messages T. Alternatively, the receiving device 21 can also obtain the information, as already explained above, indirectly via timestamps or counter values allocated to the digital input measurement values $M_E$. The information Z relating to the sampling time may be derived, for example, from a timestamp or counter value.

The information elements I and Z relating to the sampling rate and the sampling time of the digital input measurement values $M_E$ are transferred from the receiving device 21 to a time control device 22 of the digital measurement input 20. In the case of only indirectly determined information I and/or Z, the receiving device 21 can alternatively also transfer the timestamps or counter values of the digital input measurement values $M_E$ directly to the time control device 22 which then itself determines the information elements I and/or Z via the sampling rate I or the respective sampling times.

In addition, an internal time signal $T_{Sync}$ of the automation device 11 indicating the system time is also fed to the time control device 22. On the basis of the information relating to the sampling times of the digital measurement values on the one hand and the system time on the other hand, with a known time delay, by means of the sampling in the merging unit 12*a-b* and the transmission between the merging unit 12*a-b* and the automation device 11, on the one hand a time lag between the system time and the sampling times of the digital input measurement values $M_E$ can be determined and, on the other hand, a relationship can be established between the digital input measurement values $M_E$ based on the time basis of the respective merging unit 12*a-b* and the digital output measurement values $M_A$ to be formed in the signal conversion device 26 and based on the system time of the automation device 11.

The digital input measurement values $M_E$ obtained from the data messages T are transferred from the receiving device 21 to the signal conversion device 26 which has a digital encoder filter 23 on the input side. The encoder filter may, for example, have a transmission function with a PD characteristic. The digital input measurement values $M_E$ are filtered in the digital encoder filter 23 with formation of encoded digital input measurement values $M_E^*$. Following the filtering with the encoder filter 23, the encoded digital measurement values $M_E^*$ are fed to an interpolator 24 which carries out an interpolation using a signal model based on the encoded digital measurement values $M_E^*$ with formation of digital auxiliary measurement values $M_H$ and adapts the sampling rate and the respective sampling time of the encoded digital input measurement values $M_E^*$ to the required sampling rate and the required sampling times. For this purpose, the interpolator 24 uses the information relating to the sampling rate or the sampling times of the digital measurement values provided by the time control device 22 on the one hand and the system time on the other hand. The interpolator 24 calculates digital auxiliary measurement values $M_H$ through interpolation at a sampling rate of 16 kHz, for example using the encoded digital input measurement values $M_E^*$, at sampling times specified by the system time. The digital auxiliary measurement values $M_H$ are forwarded from the interpolator 24 on the output side to a decoder filter 25 which, for example, has a low-pass characteristic. Here, the decoder filter 25 performs, inter alia, a band limitation function by limiting unwanted high-frequency components. On the output side, the decoder filter 25 outputs the digital output measurement values $M_A$, the sampling rate and sampling times of which are adapted to the values required for further processing in the processor module 17b (cf. FIG. 1). In particular, the sampling rate and sampling times of the digital output measurement values $M_A$ correspond, following the processing in the signal conversion device 26, to the sampling rate used to form the local digital measurement values $M_{lok}$ and the sampling times of the local digital measurement values $M_{lok}$.

The transmission functions of the encoder filter 23 and the decoder filter 25 can advantageously be matched with one another so that the resulting summation transmission function effects an adaptation of the time delay of the formed digital output measurement values $M_A$ to the local digital measurement values $M_{lok}$ by influencing the phase response of the digital input measurement values $M_E$. This is explained in detail in FIGS. 3 and 4.

Figure 3:
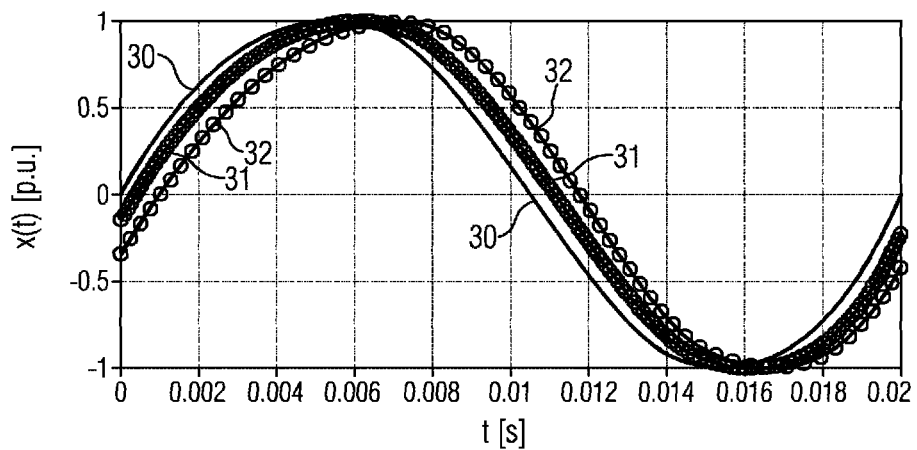
FIG. 3 shows a diagram with sequences of an analog signal, a sequence of digital input measurement values generated with a merging unit and a sequence of local digital measurement values captured with an automation device.

For this purpose, FIG. 3 shows in a diagram, on the one hand, the normalized (p.u.=per unit) sequence of an analog measurement signal 30 in the power grid over time t. On the other hand, a sequence 31 of local digital measurement values $M_{lok}$ generated by local sampling of the analog measurement signal 30 in the automation device and a sequence 32 of digital input measurement values $M_E$ generated by sampling the analog measurement signal 30 in a merging unit and subsequent transmission to the automation device are indicated in the diagram. In the sequences 31 and 32, a sampling value is indicated in each case by an ellipsis.

The sequences 31 and 32 are temporally shifted compared with the analog measurement signal 30; the respective temporal shift results from the processing time in the sampling and, where relevant, from the transmission time. It is evident, on the one hand, that the local digital measurement values $M_{lok}$ have been generated at a significantly higher sampling rate (the ellipses are closer together) than the digital input measurement values $M_E$ of the merging unit. On the other hand, it is also clear that, due to the sampling in the merging unit and the subsequent transmission of the digital input measurement values $M_E$, the sequence 32 has a significantly greater temporal shift in relation to the analog measurement signal 30 than the sequence 31 of the local digital measurement values $M_{lok}$.

Figure 4:
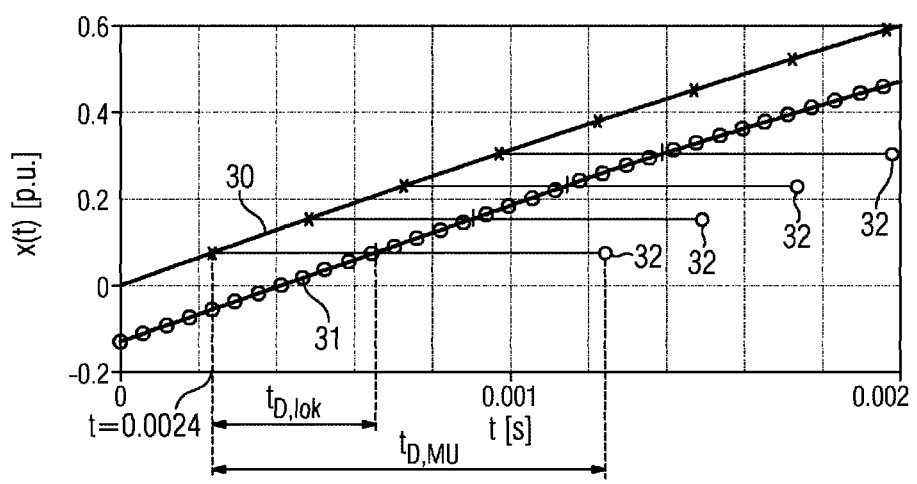
FIG. 4 shows a diagram with an enlarged section from the diagram shown in FIG. 3.

This is highlighted again in FIG. 4. For this purpose, FIG. 4 highlights enlarged sections of the area of the diagram from FIG. 3 between t=0 s and t=0.002 s. The sequences 30, 31 and 32 of the analog signal, the local digital measurement values $M_{lok}$ and the digital input measurement values $M_E$ can again be recognized. On the one hand, the time delay $t_{D,lok}$ until the generation of a corresponding local digital measurement value $M_{lok}$ for the time t=0.0024 s and the time delay $t_{D,MU}$ until the generation of a digital input measurement value $M_E$ by the merging unit and its transmission to the automation device are furthermore shown.

In order to be able to compare the two sequences 31 and 32 with one another, on the one hand the sampling rate and sampling times of the digital input measurement values $M_E$ and the local digital measurement values $M_{lok}$ must be adapted to one another by the signal conversion device 26 (cf. FIG. 2) and, on the other hand, the time delay in the provision of the respective measurement values in the automation device must be standardized. In order to guarantee the shortest possible response time of the automation device on the whole, the sequence 31 of the local digital measurement values $M_{lok}$ is selected as the reference signal for this purpose.

To do this, on the one hand the sampling rate of the digital input measurement values $M_E$ is increased accordingly by the interpolator and, on the other hand, its sampling times are synchronized with those of the local digital measurement values $M_{lok}$. Due to the interaction of the encoder filter and the decoder filter, the phase response of the digital input measurement values $M_E$ is influenced accordingly in order to even out the difference between the two time delays $t_{D,MU}-t_{D,lok}$ of the sequences 31 and 32. As a result, the sequence 32 of the digital input measurement values $M_E$ is made to overlap more or less with the sequence 31 of the local digital measurement values $M_{lok}$.

In summary, the digital input measurement values $M_E$ received from the merging unit are therefore filtered by means of the encoder filter without prior sampling rate conversion. Digital auxiliary measurement values $M_H$ are formed from the resulting encoded digital input measurement values $M_E^*$ by means of the interpolator at the required new sampling times with the required new sampling rate from the encoded digital measurement values $M_E^*$. The new sampling value stream resulting from the digital auxiliary measurement values $M_H$ is converted by means of the decoder filter into the digital output measurement values $M_A$ of the new sampling rate.

If no temporal shift is required by the signal processing in the signal conversion device, the convolution of the transmission functions of the encoder filter and the decoder filter forms the value 1 in the time domain. This is possible whenever the sampling rates are identical before and after the interpolation or a higher sampling rate is used after the interpolation. Furthermore, by selecting a summation transmission function with a specified frequency-dependent or constant group delay for the convoluted transmission functions of the encoder filter and the decoder filter, a frequency-dependent temporal shift can be set so that the resulting group delay of the digital input measurement values $M_E$ is adapted exactly to the group delay of the local digital measurement values $M_{lok}$. In this way, the transmission characteristic of the digital input measurement values $M_E$ received from a merging unit can, as it were, be adapted to the transmission characteristic of the local digital measurement values $M_{lok}$. If the group delay of the digital input measurement values $M_E$ from the merging unit is already greater than the group delay of the local digital measurement values $M_{lok}$, the group delay of the input measurement values $M_E$ can also be set to an integral multiple of the group delay of the local digital measurement values $M_{lok}$. A delay in the value stream of the local digital measurement values by the number of sampling values corresponding to the difference between the two groups delays then supplies value streams that are synchronous with one another.

The interpolation is carried out on the basis of a signal model so that interpolation errors only above half the original sampling frequency are generated in the interpolated sequence of the digital auxiliary measurement values $M_H$ and these interpolation errors are suppressed by the decoder filter to the extent that the interpolation errors in the sequence of digital output measurement values $M_A$ provided at the output of the decoder filter have an amplitude below the required signal resolution.

The following statements, for example, can be made in respect of the design of the filters:

The method described can be implemented e.g. by the use of digital IIR filters for the encoder filter and the decoder filter. If no temporal shift of the sequence of digital input measurement values is to be effected by the two filters, the following summation transmission function can be used in the frequency range:

$$G(j\omega) = G_{Enc}(j\omega) \cdot G_{Dec}(j\omega) = 1.$$

Here:
$G(j\omega)$ stands for the summation transmission function in the frequency range,
$G_{Enc}(j\omega)$ stands for the transmission function of the encoder filter,
$G_{Dec}(j\omega)$ stands for the transmission function of the decoder filter,
$\omega$ stands for the angular frequency, and
j stands for the imaginary number.

In this case, a summation transmission function which does not modify the signal is sought for the series connection of the encoder filter and the decoder filter. This is possible whenever the sampling rates before and after the interpolation are identical or a higher sampling rate is used after the interpolation. Furthermore, by selecting a summation transmission function with a predefined, frequency-dependent or constant group delay for the convoluted transmission functions of the encoder filter and the decoder filter, a frequency-dependent temporal shift can be set so that the resulting group delay of the digital input measurement values is adapted exactly to the group delay of the local digital measurement values. In this way, the transmission characteristic of the digital input measurement values received from the merging unit can be adapted to the transmission characteristic of the local digital measurement values.

In the case of a sampling rate of the digital output measurement values which is lower than the original sampling rate, a low-pass characteristic must be selected for the summation transmission function of both filters with the correspondingly required anti-aliasing characteristics.

For example, a transmission function $$G_{Enc}(j\omega) = \left(\frac{1 + j\omega T_o}{1 + j\omega T_u}\right)^n$$

can be used for the encoder filter. Here:
$T_o$ stands for an upper time constant of the filter,
$T_u$ stands for a lower time constant of the filter, and
n stands for the filter order.
For the decoder filter, the transmission function $$G_{Enc}(j\omega) = \left(\frac{1 + j\omega T_o}{1 + j\omega T_u}\right)^n$$

can be selected accordingly. By means of bilinear transformation (see e.g. http://en.wikipedia.org/wiki/Bilinear_transform), digital IIR filters which allow an implementation of the filters by means of differential equations in the form $$y_{(k)} = \sum_{i=0}^{n} B_i \cdot x_{(k-i)} - \sum_{m=1}^{n} A_m \cdot y_{(k-m)}$$

can be designed from the analog transmission functions indicated above. Here:

A and B stand for the filter coefficients,
k stands for the counter value of the respective measurement value,
x stands for the measurement values present at the input of the filter, and
y stands for the measurement values output at the filter on the output side.

Due to the individual specification of the coefficients A and B for the individual filters, the summation transmission function can be influenced on the whole in the required manner. Insofar as the digital measurement input is designed as an ASIC or an FPGA, the filter coefficients can be modifiably specified e.g. in a memory register of the module in question. The following parameters, for example, can be used for the filters:

$$n = 1, T_o = \frac{1}{2 \cdot \pi \cdot 20000}, T_u = \frac{1}{2 \cdot \pi \cdot 50}.$$

A signal model in the form of a quadratic function, for example, can be used for the interpolator:

$$y_{(k)} = a \cdot x_{(k)}^2 + b \cdot x_{(k)} + c.$$

Figure 5:
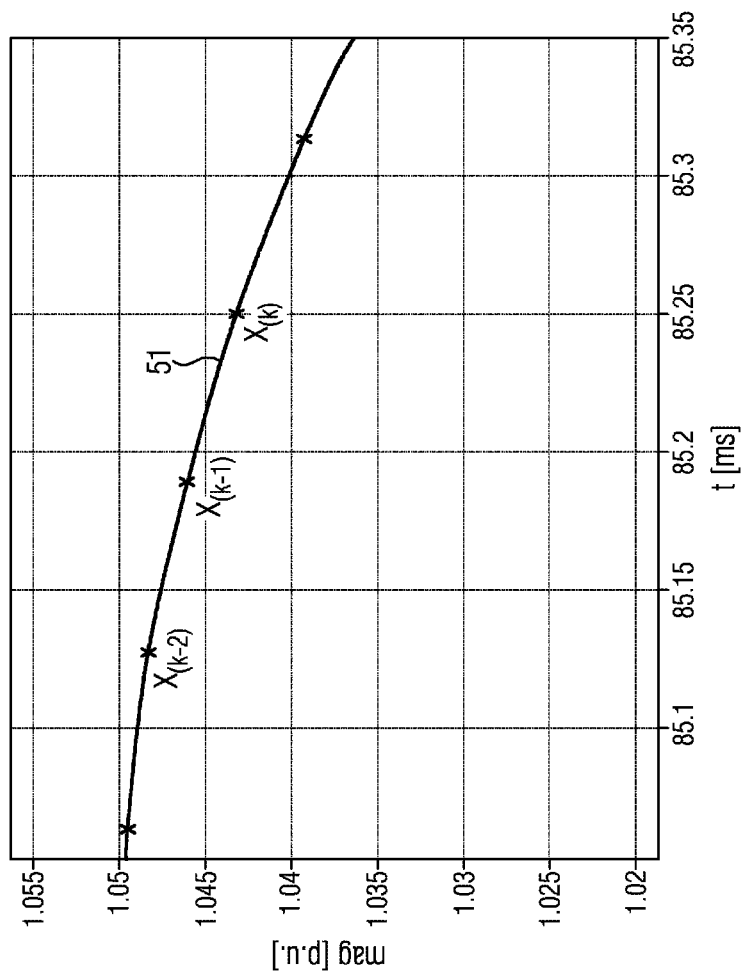
FIG. 5 shows a diagram to explain the procedure in the interpolation on the basis of the digital input measurement values.

The interpolator coefficients a, b and c can be formed by means of coefficient comparison from the last three sampling values of the data stream present at the input of the interpolator. This is shown by way of example in FIG. 5, which shows a diagram with a sequence of encoded digital input measurement values $x_{(k-2)}$, $x_{(k-1)}$ and $x_{(k)}$, and with an interpolated sequence 51. The coefficients a, b, c can be defined as follows:

$$c = x_{(k-2)}, a = \frac{2 \cdot x_{(k-1)} - x_k - c}{2 \cdot t_a^2}, b = \frac{x_{(k-1)} - a \cdot t_a^2 - c}{t_a}.$$

The time lag between two digital measurement values specified by the sampling rate is denoted here as $t_a$. The reference point for t=0 of the calculated coefficients of the signal model is $x_{(k-2)}$ here. The digital auxiliary measurement values $M_H$ of the sequence for the required sampling times which is output by the interpolator on the output side can now be calculated from the encoded digital input measurement values $M_E^*$ present at the input of the interpolator using the signal model in the form indicated above. A different sampling rate can also be selected for said sampling times, e.g. the sampling rate can be increased from 4 kHz to 16 kHz.

Additional spectral components which were not contained in the original signal are generated by the interpolation in the sequence of the auxiliary measurement values $M_H$ present on the output side. These spectral components are then suppressed by the filtering with the decoder filter to the extent that the harmonics induced by the interpolation can be ignored.

Figure 6:
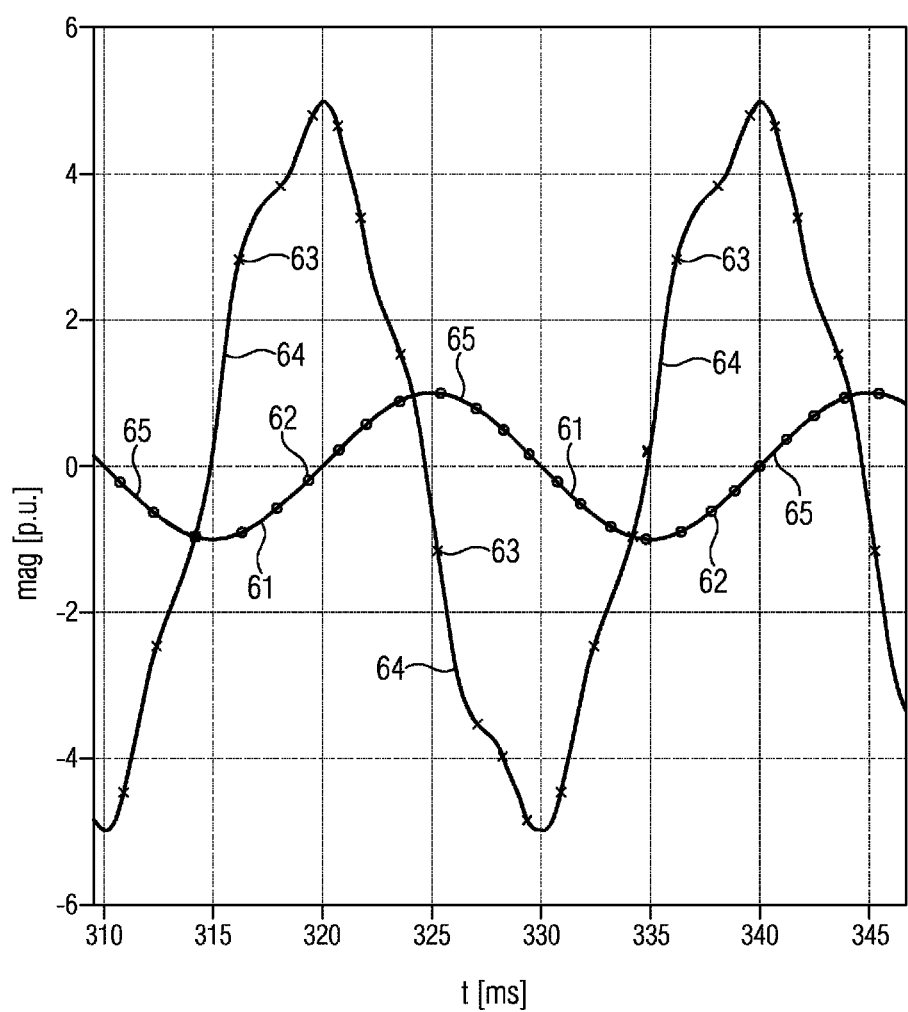
FIG. 6 shows a diagram with different signal sequences to explain the data processing in a signal conversion device.

Finally, FIG. 6 shows the sequences of a measurement signal at different locations in the processing chain. In FIG. 6, reference number 61 denotes the sequence of the analog measurement signal before the sampling by the merging unit. Digital input measurement values 62 indicated by circles are generated in the sampling and are transmitted to the automation device. A sequence of encoded digital input measurement values 63 (indicated by crosses in FIG. 6) is generated in the encoder filter of the signal conversion device from the sequence of digital input measurement values 62 present at the filter input and is transferred to the interpolator. The interpolator adapts the sampling rate and/or sampling times of the sequence of encoded digital input measurement values 63 to the required parameters and generates a sequence 64 of digital auxiliary measurement values on the output side. Said auxiliary measurement values are finally fed to the decoder filter which outputs a sequence 65 of digital output measurement values, adapted in respect of the sampling rate and sampling times. As indicated in FIG. 6, this sequence 65 overlaps the analog measurement signal 61 as required.

The digital measurement input is preferably implemented according to the invention by means of a VHDL or schematics implementation in an FPGA or an ASIC in order to prevent any delays through a firmware implementation.

With the described digital measurement input of an automation device and the described method for processing digital input measurement values, the sampling rate and/or sampling times can be adapted on the one hand for each incoming sequence of digital input measurement values. In addition, as explained, it is possible to adapt the digital input measurement values to local digital measurement values sampled directly by the automation device. Furthermore, a plurality of sequences of digital input measurement values can be adapted to one another. The respectively used merging units can use different sampling rates and different sampling times so that the usability of the digital input measurement values remains guaranteed through the described formation of digital output measurement values, even in the event of failure of an external synchronization.

It is also conceivable within the scope of the invention for a plurality of external time synchronization signals to be used in each case for a merging unit or a group of merging units. These time synchronization signals can also be generated by the merging units themselves. In this way, the input measurement values supplied by these merging units can still be synchronized with local digital measurement values even if the time synchronization signal for synchronizing the merging units fails.

The invention claimed is:

1. A digital measurement input for an electric automation device, the digital measurement input comprising:
   a receiving device configured to receive digital input measurement values which have been generated by sampling an analog measurement signal at a first sampling rate via a merging unit being different from the electric automation device; and
   a signal conversion device configured to form and provide digital output measurement values from the digital input measurement values, at least one of a sampling rate or sampling times of the digital output measurement values is adapted to at least one of a specified sampling rate or specified sampling times, said signal conversion device having a digital encoder filter on an input side and a decoder filter on an output side, between which an interpolator is disposed, said encoder filter, said interpolator and said decoder filter are matched to one another so that an adaptation of at least one of a sampling rate or sampling times of the digital input measurement values is effected by said signal conversion device.

2. The digital measurement input according to claim 1, wherein said interpolator is configured to generate interpolated digital auxiliary measurement values using a signal model.

3. The digital measurement input according to claim 2, wherein the signal model describes a quadratic function.

4. The digital measurement input according to claim 1, wherein said encoder filter and said decoder filter have individual transmission functions which can be matched to one another so that their common transmission function effects an adjustable shift of a phase response of a sequence of digital input measurement values in order to generate a required temporal shift of the digital output measurement values compared to the digital input measurement values.

5. The digital measurement input according to claim 1, wherein said encoder filter has a PD characteristic and said decoder filter has a low-pass characteristic.

6. The digital measurement input according to claim 1, wherein the digital measurement input is configured in a form of a processing module with hardware-defined programming.

7. The digital measurement input according to claim 6, wherein said processing module has a memory register in which filter coefficients of at least one of said encoder filter or said decoder filter are modifiably stored.

8. The digital measurement input according to claim 1, wherein said receiving device is configured to receive the digital input measurement values in a form of data messages.

9. The digital measurement input according to claim 8, wherein said receiving device is configured to extract information relating to the first sampling rate from the data messages containing the digital input measurement values and forward the information to said signal conversion device.

10. The digital measurement input according to claim 1, wherein the digital measurement input is configured as an ASIC or an FPGA.

11. An electric automation device, comprising:
    a digital measurement input, containing:
        a receiving device configured to receive digital input measurement values which have been generated by sampling an analog measurement signal at a first sampling rate via a merging unit being different from the electric automation device; and
        a signal conversion device configured to form and provide digital output measurement values from the digital input measurement values, at least one of a sampling rate or sampling times of the digital output measurement values is adapted to at least one of a specified sampling rate or specified sampling times, said signal conversion device having a digital encoder filter on an input side and a decoder filter on an output side, between which an interpolator is disposed, said encoder filter, said interpolator and said decoder filter are matched to one another so that an adaptation of at least one of a sampling rate or sampling times of the digital input measurement values is effected by said signal conversion device.

12. The electric automation device according to claim 11, further comprising at least one analog signal input configured to capture a local analog measurement signal and to form local digital measurement values; and
    wherein said signal conversion device of said digital measurement input is configured to use at least one of a sampling rate or sampling times of the local digital measurement values as at least one of the specified sampling rate or the specified sampling times in order to adapt at least one of the sampling rate or the sampling times of the digital input measurement values.

13. The electric automation device according to claim 11, further comprising at least one further digital measurement input which is configured according to said digital measurement input.

14. The electric automation device according to claim 11, wherein said digital measurement input is configured to receive and process a plurality of sequences of digital input measurement values.

15. A method for processing digital input measurement values having been generated by sampling an analog measurement signal at a first sampling rate, which comprises the steps of:

receiving the digital input measurement values via a receiving device of a digital measurement input of an automation device, the digital input measurement values being generated in a merging unit being different from the automation device;

forming and providing digital output measurement values with a signal conversion device of the digital measurement input from the digital input measurement values, at least one of a sampling rate or sampling times of the digital output measurement values are adapted to at least one of a specified sampling rate or specified sampling times;

filtering the digital input measurement values with a digital encoder filter of the signal conversion device with formation of encoded digital input measurement values;

interpolating the encoded digital input measurement values with an interpolator of the signal conversion device with formation of digital auxiliary measurement values; and filtering the digital auxiliary measurement values with a digital decoder filter of the signal conversion device with formation of the digital output measurement values, the encoder filter, the interpolator and the decoder filter are matched to one another so that they effect an adaptation of at least one of a sampling rate or sampling times of the digital input measurement values.

16. The method according to claim 15, wherein a common transmission function resulting from a linking of individual transmission functions of the encoder filter and the decoder filter effects an adjustable shift of a phase response of a sequence of digital input measurement values in order to generate a required temporal shift of the digital output measurement values compared with the digital input measurement values.

* * * * *